United States Patent
Lin et al.

(10) Patent No.: US 8,199,076 B2
(45) Date of Patent: Jun. 12, 2012

(54) PIXEL CIRCUIT

(75) Inventors: Chih-Lung Lin, Tainan County (TW); Kuan-Wen Chou, Kaohsiung (TW)

(73) Assignee: National Cheng Kung University, Tainan (TW)

( * ) Notice: Subject to any disclaimer, the term of this patent is extended or adjusted under 35 U.S.C. 154(b) by 819 days.

(21) Appl. No.: 12/261,214

(22) Filed: Oct. 30, 2008

(65) Prior Publication Data
US 2010/0109717 A1 May 6, 2010

(51) Int. Cl.
*G09G 3/30* (2006.01)
(52) U.S. Cl. ............... 345/76; 345/82; 345/204
(58) Field of Classification Search .......... None
See application file for complete search history.

(56) References Cited

U.S. PATENT DOCUMENTS

| | | | | |
|---|---|---|---|---|
| 6,774,877 B2 * | 8/2004 | Nishitoba et al. | ............... | 345/76 |
| 6,881,635 B1 * | 4/2005 | Chidambarrao et al. | ..... | 438/300 |
| 2004/0080475 A1 * | 4/2004 | Yoshida | .......................... | 345/82 |
| 2005/0052377 A1 * | 3/2005 | Hsueh | .............................. | 345/82 |
| 2006/0221662 A1 * | 10/2006 | Park et al. | ..................... | 365/145 |
| 2007/0002084 A1 * | 1/2007 | Kimura et al. | ................ | 345/694 |
| 2008/0259064 A1 * | 10/2008 | Chiou | ........................... | 345/205 |

* cited by examiner

*Primary Examiner* — Amare Mengistu
*Assistant Examiner* — Antonio Xavier
(74) *Attorney, Agent, or Firm* — Ladas & Parry LLP

(57) ABSTRACT

A pixel circuit includes an LED having an anode that receives a driving current and a cathode that receives a scan signal, and a driving circuit including: a switch unit operable according to a voltage signal, and adapted for permitting transfer of a data signal when operating in an on state; a capacitor having a first end coupled to the switch unit, and a second end; a first transistor having a first terminal that is coupled to the second end of the capacitor, a second terminal that is coupled to the anode of the LED, and a control terminal that is coupled to the first end of the capacitor; and a second transistor having a first terminal that is adapted for coupling to the voltage source, a second terminal that is coupled to the first terminal of the first transistor, and a control terminal that is adapted for receiving a reference voltage.

12 Claims, 11 Drawing Sheets

PIXEL CIRCUIT

BACKGROUND OF THE INVENTION

1. Field of the Invention

The invention relates to a pixel circuit, more particularly to a pixel circuit that includes a light emitting diode.

2. Description of the Related Art

Organic light emitting diode (OLED) displays are being increasingly widely used due to the advantages of spontaneous emission of light, high luminance, fast response time, and wide viewing angle.

A conventional OLED display utilizes a plurality of pixel circuits that are arranged in matrices and that can emit light of different colors to achieve the function of displaying images. The pixel circuits are scanned in rows or columns in sequence for determining the intensity of light each pixel circuit is to emit. With reference to FIG. 1, each of the pixel circuits includes an organic light emitting diode (OLED) 1 and a first conventional driving circuit 2. The first conventional driving circuit 2 generates a driving current ($I_{DRIVE}$). The organic light emitting diode 1 is driven by the driving current ($I_{DRIVE}$) from the first conventional driving circuit 2 to emit light with a luminance that corresponds to a magnitude of the driving current ($I_{DRIVE}$).

The first conventional driving circuit 2 includes a first transistor 201, a second transistor 202, and a capacitor 203. Each of the first and second transistors 201, 202 is a P-type thin film transistor (TFT), and has a first terminal, a second terminal, and a control terminal.

The organic light emitting diode 1 has a cathode that is adapted to coupling to a first voltage source ($V_{SS}$). The control terminal of the first transistor 201 is adapted for receiving a scan signal (SCAN). The first terminal of the first transistor 201 is adapted for receiving a data signal ($V_{DATA}$). The second terminal of the first transistor 201 is coupled electrically to the control terminal of the second transistor 202. The first terminal of the second transistor 202 is adapted for coupling to a second voltage source ($V_{DD}$). The second terminal of the second transistor 202 is coupled electrically to an anode of the organic light emitting diode 1. The control terminal of the second transistor 202 is coupled electrically to the first terminal of the second transistor 202 via the capacitor 203.

Shown in FIG. 2 are timing sequences of the scan signal (SCAN) and the data signal ($V_{DATA}$) for the first conventional driving circuit 2. When the scan signal (SCAN) is at a logic low level, the first transistor 201 is turned on, such that the data signal ($V_{DATA}$) is transferred to the control terminal of the second transistor 202, and such that the capacitor 203 stores energy from the data signal ($V_{DATA}$). On the other hand, when the scan signal (SCAN) is at a logic high level, the first transistor 201 is turned off. The second transistor 202 generates the driving current ($I_{DRIVE}$) with reference to the energy stored in the capacitor 203 according to the following formula:

$$I_{DRIVE} = \frac{1}{2}\mu_p C_{ox} \frac{W_{202}}{L_{202}}(V_{C,203} - |V_{TH,202}|)^2$$
$$= \frac{1}{2}\mu_p C_{ox} \frac{W_{202}}{L_{202}}(V_{DD} - V_{DATA} - |V_{TH,202}|)^2$$

where ($W_{202}$) and ($L_{202}$) are width and length of the second transistor 202, ($V_{C,203}$) is the voltage across the capacitor 203, and ($V_{TH,202}$) is a threshold voltage for the second transistor 202.

Since the threshold voltages of the second transistors 202 for individual pixel circuits are not identical, the driving currents ($I_{DRIVE}$) generated by the pixel circuits differ from each other even with the same data signal ($V_{DATA}$), thereby resulting in luminance variations among the light emitted by the organic light emitting diodes 1. In addition, since an electrical wire connected to the second voltage source ($V_{DD}$) has a non-zero impedance per unit length, and since the electrical wire is normally coupled electrically in sequence to the pixel circuits, the voltage drop (in particular, "IR" drop) between adjacent ones of the pixel circuits makes the actual voltages received by the pixel circuits from the second voltage source ($V_{DD}$) differ from each other, thereby also resulting in different driving currents ($I_{DRIVE}$) among the pixel circuits. Consequently, this also attributes to the difference in luminance among the organic light emitting diodes 1.

Shown in FIG. 3 is another pixel circuit that incorporates a second conventional driving circuit 2', and that also includes an organic light emitting diode 1. The second conventional driving circuit 2' includes a first transistor 211, a second transistor 212, and a capacitor 213. Each of the first and second transistors 211, 212 is an N-type thin film transistor (TFT), and has a first terminal, a second terminal, and a control terminal.

The organic light emitting diode 1 has a cathode that is adapted to coupling to a first voltage source ($V_{SS}$). The control terminal of the first transistor 211 is adapted for receiving a scan signal (SCAN). The first terminal of the first transistor 211 is adapted for receiving a data signal ($V_{DATA}$). The second terminal of the first transistor 211 is coupled electrically to the control terminal of the second transistor 212. The first terminal of the second transistor 212 is adapted for coupling to a second voltage source ($V_{DD}$). The second terminal of the second transistor 212 is coupled electrically to the second terminal of the first transistor 211 via the capacitor 213, and is coupled electrically to an anode of the organic light emitting diode 1.

Shown in FIG. 4 are timing sequences of the scan signal (SCAN) and the data signal ($V_{DATA}$) for the second conventional driving circuit 2'. When the scan signal (SCAN) is at a logic high level, the first transistor 211 is turned on, such that the data signal ($V_{DATA}$) is transferred to the control terminal of the second transistor 212, and such that the capacitor 213 stores energy from the data signal ($V_{DATA}$). On the other hand, when the scan signal (SCAN) is at a logic low level, the first transistor 211 is turned off. The second transistor 212 generates the driving current ($I_{DRIVE}$) with reference to the energy stored in the capacitor 213 according to the following formula:

$$I_{DRIVE} = \frac{1}{2}\mu_n C_{ox} \frac{W_{212}}{L_{212}}(V_{C,213} - V_{TH,212})^2$$
$$= \frac{1}{2}\mu_n C_{ox} \frac{W_{212}}{L_{212}}(V_{DATA} - V_{OLED} - V_{TH,212})^2$$

where ($W_{212}$) and ($L_{212}$) are width and length of the second transistor 212, ($V_{C,213}$) is the voltage across the capacitor 213, and ($V_{TH,212}$) is a threshold voltage for the second transistor 212.

Since the threshold voltages of the second transistors 212 for individual pixel circuits are not identical, the driving currents ($I_{DRIVE}$) generated by the pixel circuits differ from each other even with the same data signal ($V_{DATA}$), thereby resulting in luminance variations among the light emitted by the organic light emitting diodes 1. In addition, as the organic light emitting diode 1 of each pixel circuit ages with time, voltage drop across the organic light emitting diode 1 would also increase, thereby resulting in a reduction in the driving current ($I_{DRIVE}$).

As shown in FIG. 5, yet another pixel circuit incorporating a third conventional driving circuit 2" has been proposed in Taiwanese Patent No. 228696 in order to diminish the effect of the threshold voltage differences and the variations in actual voltage received from the voltage source on luminance variations of the organic light emitting diodes of the pixel circuits. The third conventional driving circuit 2" includes a first transistor 221, a second transistor 222, a third transistor 223, a fourth transistor 224, a fifth transistor 225, and a capacitor 226. Each of the first to fifth transistors 221~225 is a P-type TFT, and has a first terminal, a second terminal, and a control terminal. The pixel circuit further includes an organic light emitting diode 1 having a cathode that is adapted for coupling to a first voltage source ($V_{SS}$).

The control terminal of the first transistor 221 is adapted for receiving a current scan signal ($SCAN_k$). The first terminal of the first transistor 221 is adapted for receiving a data signal ($V_{DATA}$). The second terminal of the first transistor 221 is connected electrically to the first terminal of the second transistor 222 (this node is hereinafter referred to as node (A)). The control terminal of the second transistor 222 is connected electrically to the second terminal of the second transistor 222, to the first terminal of the third transistor 223, to the control terminal of the fourth transistor 224, and to one end of the capacitor 226 (this node is hereinafter referred to as node (B)). The control terminal of the third transistor 223 is adapted for receiving a previous scan signal ($SCAN_{k-1}$). The second terminal of the third transistor 223 is adapted to be connected to ground. The first terminal of the fourth transistor 224 is connected electrically to the other end of the capacitor 226, and is adapted for coupling to a second voltage source ($V_{DD}$). The second terminal of the fourth transistor 224 is connected electrically to the first terminal of the fifth transistor 225. The control terminal of the fifth transistor 225 is adapted for receiving a control signal (CTRL). The second terminal of the fifth transistor 225 is connected electrically to an anode of the organic light emitting diode 1.

Shown in FIG. 6 are timing sequences of the current and previous scan signals ($SCAN_k$), ($SCAN_{k-1}$), and the control signal (CTRL) for the third conventional driving circuit 2". When the previous scan signal ($SCAN_{k-1}$) is at a logic low level, the current scan signal ($SCAN_k$) is at a logic high level, and the control signal (CTRL) is at a logic high level, the third transistor 223 is turned on, the first transistor 221 is turned off, and the fifth transistor 225 is turned off, such that ground voltage is transferred to the node (B), and the fourth transistor 27 does not generate the driving current ($I_{DRIVE}$).

When the previous scan signal ($SCAN_{k-1}$) is at a logic high level, the current scan signal ($SCAN_k$) is at a logic low level, and the control signal (CTRL) is at a logic high level, the third transistor 223 is turned off, the first transistor 221 is turned on, and the fifth transistor 225 is turned off, such that the data signal ($V_{DATA}$) is transferred to the node (A). The voltage at the node (B) is pulled up through the second transistor 222 until the voltage at the node (B) is equal to the data signal ($V_{DATA}$) subtracted by the absolute value of the threshold voltage for the second transistor 222. In this situation, the fourth transistor 224 does not generate the driving current ($I_{DRIVE}$).

When the previous scan signal ($SCAN_{k-1}$) is at a logic high level, the current scan signal ($SCAN_k$) is at a logic high level, and the control signal (CTRL) is at a logic low level, the third transistor 223 is turned off, the first transistor 221 is turned off, and the fifth transistor 225 is turned on. The fourth transistor 224 generates the driving current ($I_{DRIVE}$) with reference to the voltage across the capacitor 226 according to the following formula:

$$I_{DRIVE} = \frac{1}{2}\mu_P C_{ox} \frac{W_{224}}{L_{224}}(V_{C,226} - |V_{TH,224}|)^2$$
$$= \frac{1}{2}\mu_P C_{ox} \frac{W_{224}}{L_{224}}(V_{DD} - V_B - |V_{TH,224}|)^2$$
$$= \frac{1}{2}\mu_P C_{ox} \frac{W_{224}}{L_{224}}(V_{DD} - V_{DATA} + |V_{TH,222}| - |V_{TH,224}|)^2$$

where ($W_{224}$) and ($L_{224}$) are respectively width and length of the fourth transistor 224, ($V_{C,226}$) is the voltage across the capacitor 226, ($V_B$) is the voltage at the node (B), ($V_{TH,224}$) is the threshold voltage for the fourth transistor 224, and ($V_{TH,222}$) is the threshold voltage for the second transistor 222. Since the second and fourth transistors 222, 224 are very close to each other in location, the threshold voltages thereof can be assumed to be identical. Therefore, the formula can be simplified and rewritten as follows.

$$I_{DRIVE} = \frac{1}{2}\mu_P C_{ox} \frac{W_{224}}{L_{224}}(V_{DD} - V_{DATA})^2$$

As can be seen from the formula, the effect on the driving current ($I_{DRIVE}$) due to the threshold voltage of the fourth transistor 224 for each of the pixel circuits is canceled out by that due to the threshold voltage of the second transistor 222. Furthermore, by making an electrical wire connected to the second voltage source ($V_{DD}$) connect to the pixel circuits that receive identical scan signals (either the previous scan signal ($SCAN_{k-1}$) or the current scan signal ($SCAN_k$)), since these pixel circuits simultaneously receive the data signal ($V_{DATA}$) when the driving currents ($I_{DRIVE}$) are not generated, (so that no current passes through the electrical wire), the voltages received from the second voltage source ($V_{DD}$) by the set of pixel circuits that receive the same scan signals (either the previous scan signal ($SCAN_{k-1}$) or the current scan signal ($SCAN_k$)) are identical. Consequently, the effect of different actual voltages received from the second voltage source ($V_{DD}$) upon the voltages across the capacitors 226 of the pixel circuits can be eliminated such that the driving currents ($I_{DRIVE}$) generated by the pixel circuits are identical to each other with the same data signal ($V_{DATA}$), thereby resulting in identical luminance among the light emitted by the organic light emitting diodes 1.

However, although the third conventional driving circuit 2" is capable of reducing the effects of the threshold voltage differences and the variations in the actual voltage received from the voltage source on the luminance variations of the organic light emitting diodes 1, three more transistors are required in the third conventional driving circuit 2" as compared to the first and second conventional driving circuits 2, 2' (as shown in FIG. 1 and FIG. 3, respectively), thereby reducing an aperture ratio (i.e., a ratio of coverage area of effective illuminating display region) of the OLED display utilizing the third conventional driving circuit 2". Consequently, utilization efficiency of the light is diminished.

SUMMARY OF THE INVENTION

Therefore, the object of the present invention is to provide a pixel circuit that can minimize the effect of threshold voltage and/or source voltage variations, so as to achieve a higher aperture ratio for a display incorporating the same and a longer service life for a light emitting diode include in the pixel circuit.

According to one aspect of the present invention, there is provided a pixel circuit that includes a light emitting diode, and a driving circuit. The light emitting diode has an anode that receives a driving current, and a cathode that is adapted for receiving a scan signal. The driving circuit includes a switch unit, a capacitor, a first transistor, and a second transistor. The switch unit is adapted for coupling to a voltage source, is operable in one of an on state and an off state according to a voltage signal from the voltage source, and is adapted for permitting transfer of a data signal when operating in the on state. The capacitor has a first end that is coupled electrically to the switch unit, and a second end. The first transistor has a first terminal that is coupled electrically to the second end of the capacitor, a second terminal that is coupled electrically to the anode of the light emitting diode, and a control terminal that is coupled electrically to the first end of the capacitor. The second transistor has a first terminal that is adapted for coupling to the voltage source, a second terminal that is coupled electrically to the first terminal of the first transistor, and a control terminal that is adapted for receiving a reference voltage.

According to another aspect of the present invention, there is provided a pixel circuit that includes a light emitting diode, and a driving circuit. The light emitting diode has an anode that receives a driving current, and a cathode that is adapted for receiving a scan signal. The driving circuit includes a switch unit, a capacitor, a first transistor, and a second transistor. The switch unit is adapted for coupling to a voltage source, is operable in one of an on state and an off state according to a voltage signal from the voltage source, and is adapted for permitting transfer of a data signal when operating in the on state. The capacitor has a first end that is coupled electrically to the switch unit, and a second end. The first transistor has a first terminal that is adapted for coupling to the voltage source, a second terminal that is coupled electrically to the second end of the capacitor, and a control terminal that is coupled electrically to the first end of the capacitor. The second transistor has a first terminal that is coupled electrically to the second end of the capacitor, a second terminal that is coupled electrically to the anode of the light emitting diode, and a control terminal that is adapted for receiving a reference voltage.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 7:
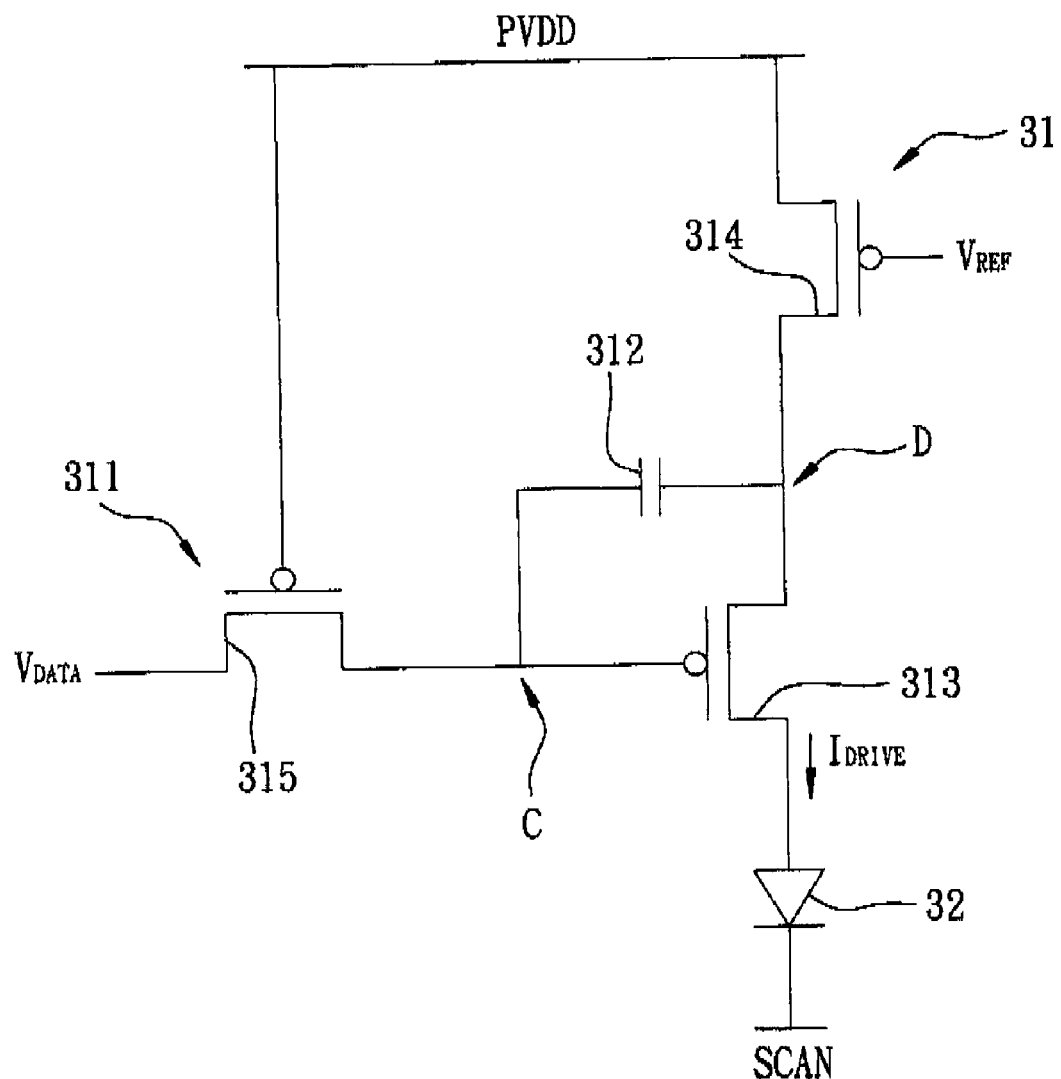
FIG. 7 is an electrical circuit diagram of the first preferred embodiment of a pixel circuit according to the present invention.

As shown in FIG. 7, the first preferred embodiment of a pixel circuit according to the present invention includes a light emitting diode 32 and a driving circuit 31. The light emitting diode 32 has an anode that receives a driving current ($I_{DRIVE}$) and a cathode that is adapted for receiving a scan signal (SCAN). In this embodiment, the light emitting diode 32 is an organic light emitting diode (OLED). The driving circuit 31 includes a switch unit 311, a capacitor 312, a first transistor 313, and a second transistor 314.

The switch unit 311 is adapted for coupling to a voltage source (PVDD), is operable in one of an on state and an off state according to a voltage signal from the voltage source (PVDD), and is adapted for permitting transfer of a data signal ($V_{DATA}$) when operating in the on state.

The capacitor 312 has a first end that is coupled electrically to the switch unit 311, and a second end.

The first transistor 313 has a first terminal that is coupled electrically to the second end of the capacitor 312, a second terminal that is coupled electrically to the anode of the light emitting diode 32, and a control terminal that is coupled electrically to the first end of the capacitor 312.

The second transistor 314 has a first terminal that is adapted for coupling to the voltage source (PVDD), a second terminal that is coupled electrically to the first terminal of the first transistor 313, and a control terminal that is adapted for receiving a reference voltage ($V_{REF}$).

In this embodiment, the switch unit 311 includes a third transistor 315 having a first terminal that is adapted for receiving the data signal ($V_{DATA}$), a second terminal that is coupled electrically to the control terminal of the first transistor 313, and a control terminal that is adapted for coupling to the voltage source (PVDD). Each of the first, second and third transistors 313, 314, 315 is one of a P-type thin film transistor (TFT) and a P-type metal oxide semiconductor (MOS). In this embodiment, each of the first, second and third transistors 313, 314, 315 is a P-type thin film transistor.

In the following description, the second terminal of the third transistor 315, the control terminal of the first transistor 313, and the first end of the capacitor 312 are hereinafter collectively referred to as node (C). The second terminal of the second transistor 314, the second end of the capacitor 312, and the first terminal of the first transistor 313 are hereinafter collectively referred to as node (D).

Figure 8:
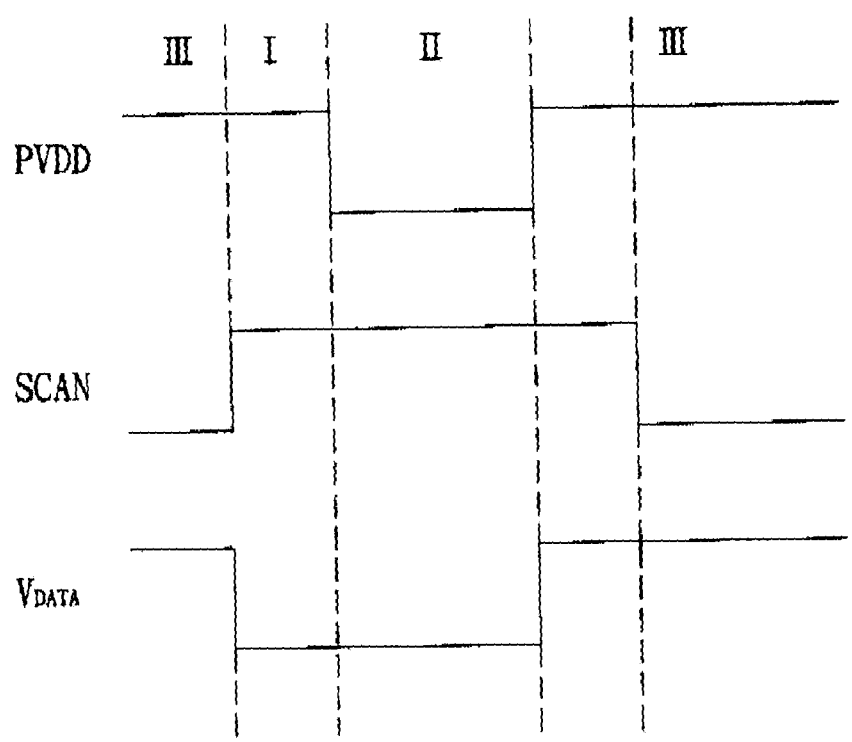
FIG. 8 illustrates timing sequences of PVDD, SCAN and $V_{DATA}$ signals for the first preferred embodiment.

Shown in FIG. 8 are timing sequences of the voltage signal from the voltage source (PVDD), the scan signal (SCAN), and the data signal ($V_{DATA}$) for the driving circuit 31. The second transistor 314 is turned on when the switch unit 311 operates in the off state, and is turned off when the switch unit 311 operates in the on state. The first transistor 313 generates the driving current ($I_{DRIVE}$) to be received by the light emitting diode 32 when the switch unit 311 operates in the off state and when the scan signal (SCAN) is at a logic low level. Operation of the first preferred embodiment can be divided into three phases, and is described in detail hereinbelow with reference to FIG. 8.

I. Preparation Phase

When the voltage signal from the voltage source (PVDD) is at a logic high level, while the scan signal (SCAN) is at a logic high level, the third transistor 315 is turned off (i.e., the switch unit 311 operates in the off state), and the second transistor 314 is turned on. At this time, the voltage at the node (D) is equal to the logic high level of the voltage signal from the voltage source (PVDD), and the first transistor 313 does not generate the driving current ($I_{DRIVE}$).

II. Data Inputting Phase

When the voltage signal from the voltage source (PVDD) is at a logic low level, and the scan signal (SCAN) is at a logic high level, the third transistor 315 is turned on (i.e., the switch unit 311 operates in the on state), and the second transistor 314 is turned off. At this time, the data signal ($V_{DATA}$) is transmitted to the node (C), and the voltage at the node (D) is pulled down from the logic high level of the voltage signal from the voltage source (PVDD) to the reference voltage ($V_{REF}$) plus the absolute value of a threshold voltage for the second transistor 314. The light emitting diode 32 is reverse biased, and the first transistor 313 does not generate the driving current ($I_{DRIVE}$).

III. Light Emitting Phase

When the voltage signal from the voltage source (PVDD) is at the logic high level, and the scan signal (SCAN) is at the logic low level, the third transistor 315 is turned off (i.e., the switch unit 311 operates in the off state), and the second transistor 314 is turned on. At this time, the light emitting diode 32 is forward biased, and the first transistor 313 generates the driving current ($I_{DRIVE}$) with reference to the voltage across the capacitor 312 according to the following formula:

$$I_{DRIVE} = \frac{1}{2}\mu_P C_{ox} \frac{W_{313}}{L_{313}} (V_{C,312} - |V_{TH,313}|)^2$$
$$= \frac{1}{2}\mu_P C_{ox} \frac{W_{313}}{L_{313}} (V_{REF} + |V_{TH,314}| - V_{DATA} - |V_{TH,313}|)^2$$

where ($W_{313}$) and ($L_{313}$) are respectively width and length of the first transistor 313, ($V_{C,312}$) is the voltage across the capacitor 312, ($V_{TH,313}$) is the threshold voltage for the first transistor 313, and ($V_{TH,314}$) is the threshold voltage for the second transistor 314. Since the first and second transistors 313, 314 are very close to each other in location, the threshold voltages thereof can be assumed to be identical. Therefore, the formula can be simplified and rewritten as follows.

$$I_{DRIVE} = \frac{1}{2}\mu_P C_{ox} \frac{W_{313}}{L_{313}} (V_{REF} - V_{DATA})^2$$

Firstly, the effect on the driving current ($I_{DRIVE}$) due to the threshold voltage of the first transistor 313 for each of the pixel circuits is canceled out by that due to the threshold voltage of the second transistor 314. Secondly, since minimal current passes through the control terminal of the second transistor 314, to which the reference voltage ($V_{REF}$) is applied, there is no voltage drop across a signal line transferring the reference voltages ($V_{REF}$), i.e., there is no difference between the reference voltage ($V_{REF}$) received by different pixel circuits. Consequently, the driving circuits 31 of different pixel circuits of the present invention can generate substantially identical driving currents ($I_{DRIVE}$) when the data signals ($V_{DATA}$) supplied thereto are the same, thereby resulting in substantially identical luminance intensity of light emitted by the light emitting diodes 32.

Figure 1:
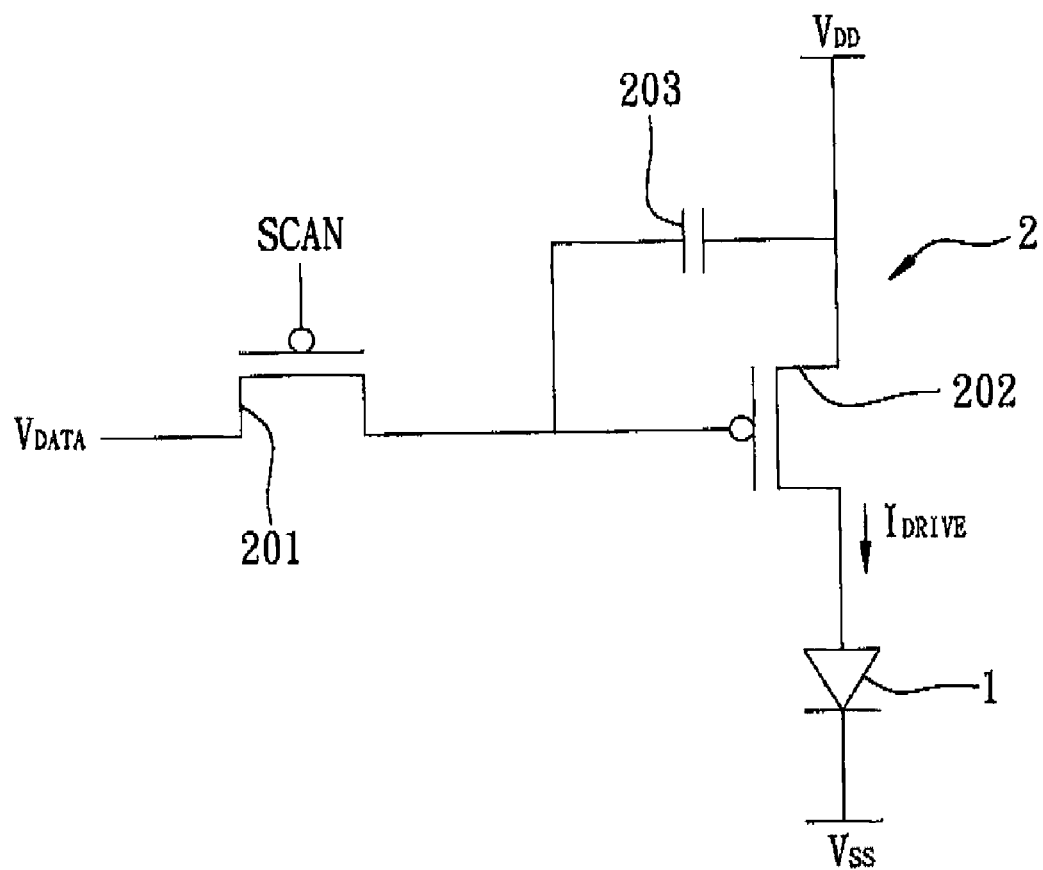
FIG. 1 is an electrical circuit diagram of a pixel circuit for a conventional OLED display.
Figure 2:
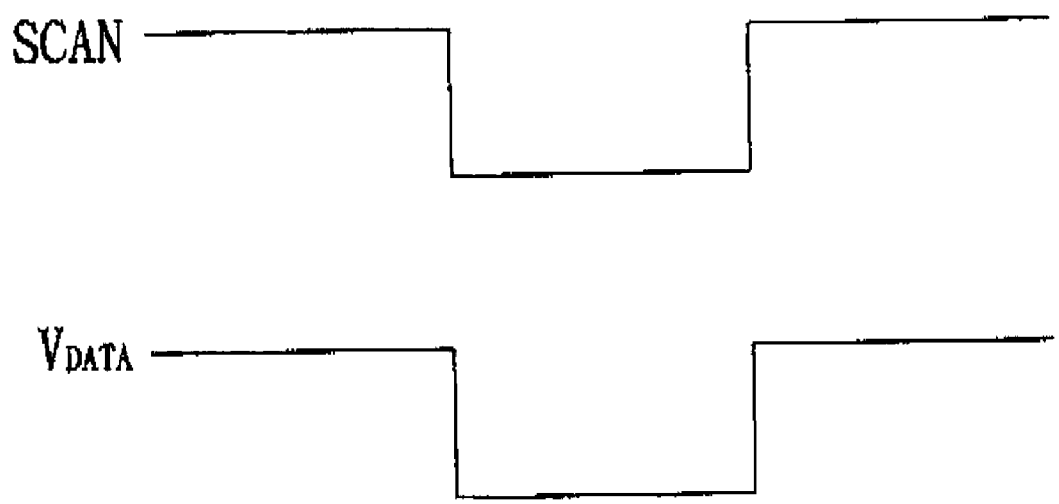
FIG. 2 illustrates timing sequences of SCAN and $V_{DATA}$ signals for a first conventional driving circuit of the pixel circuit of FIG. 1.
Figure 3:
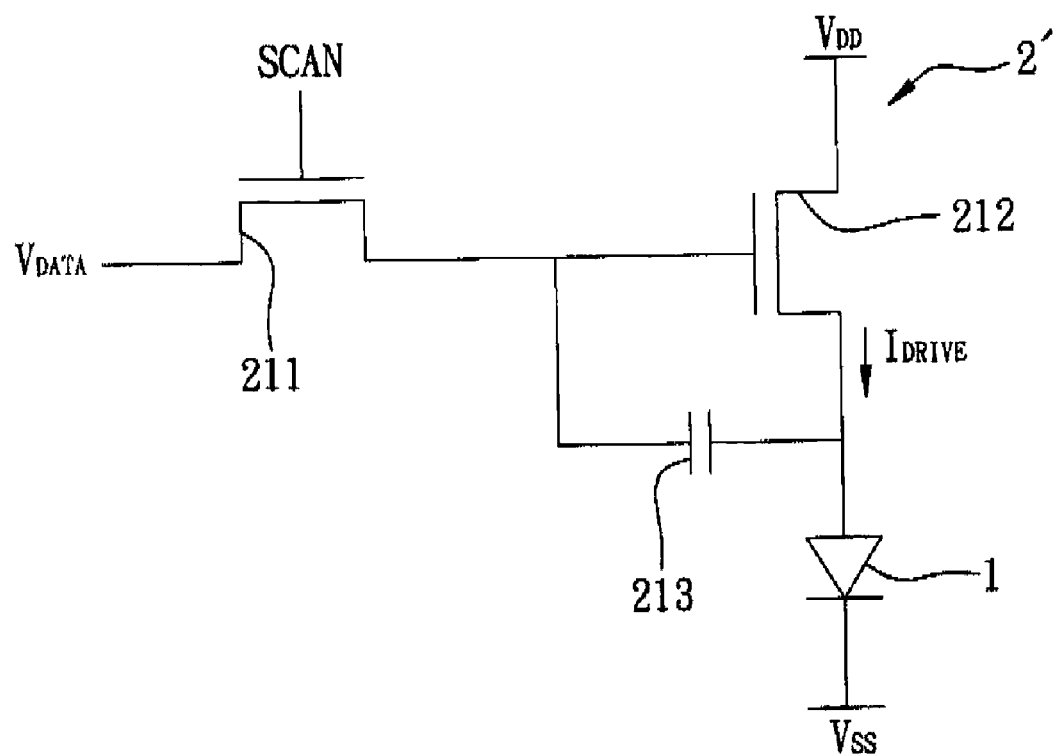
FIG. 3 is an electrical circuit diagram of a pixel circuit incorporating a second conventional driving circuit.
Figure 4:
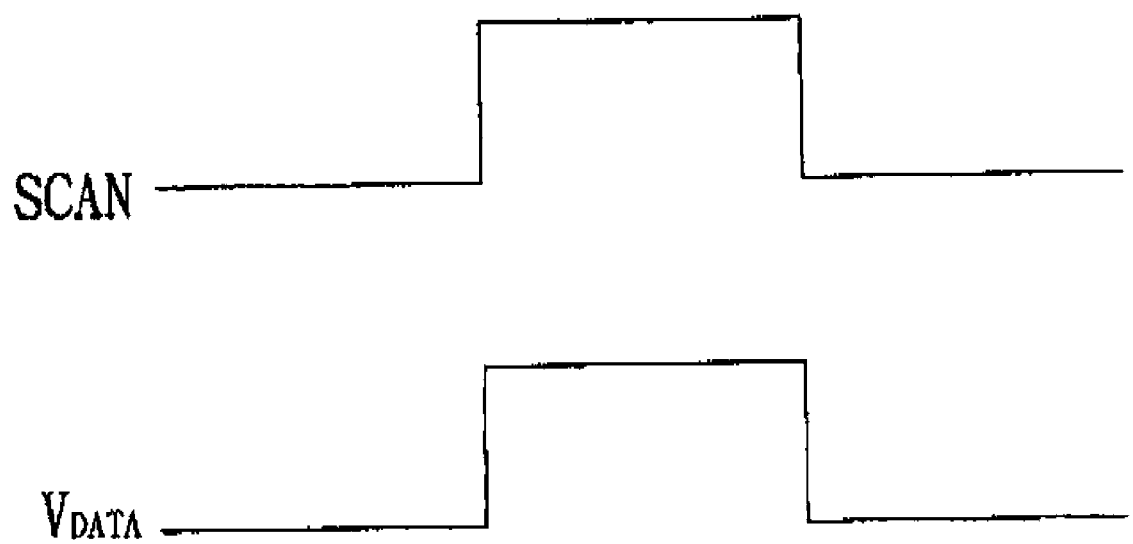
FIG. 4 illustrates timing sequences of SCAN and $V_{DATA}$ signals for the second conventional driving circuit of FIG. 3.
Figure 9:
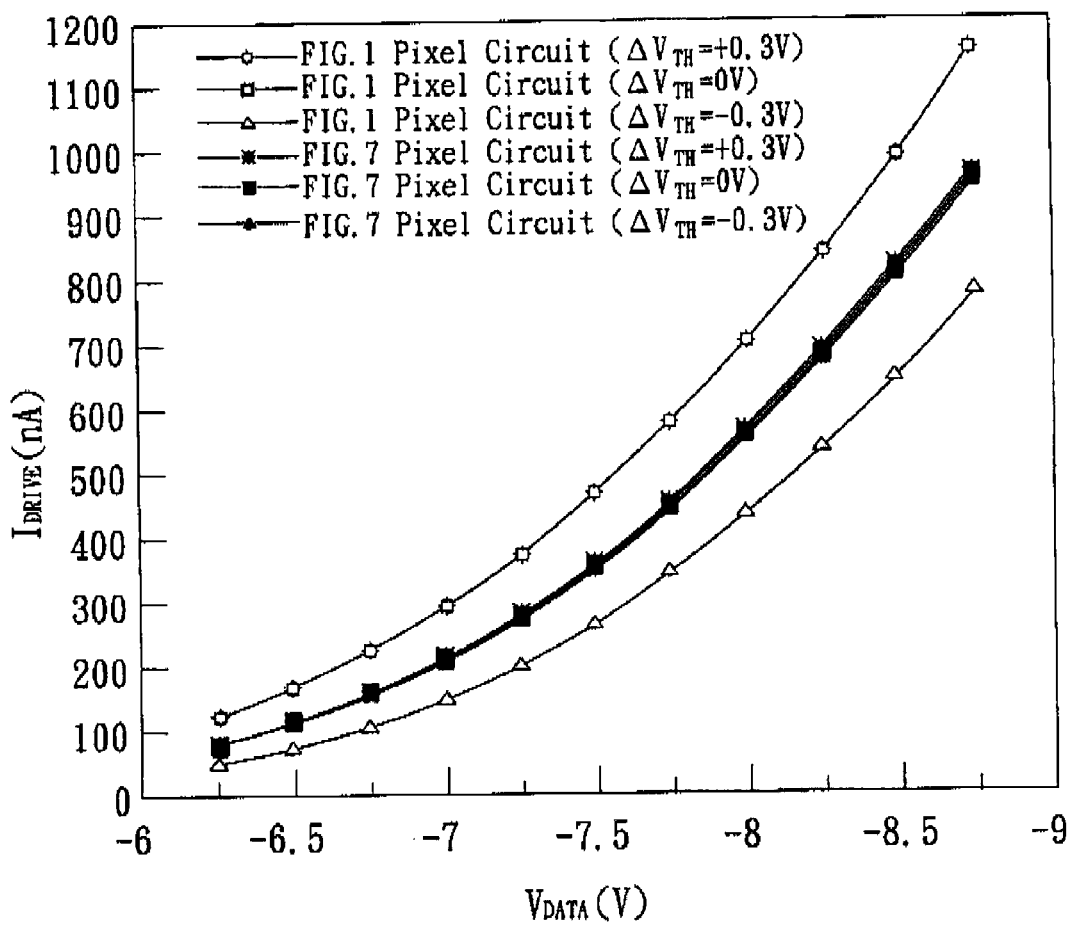
FIG. 9 shows simulation results to compare driving currents generated by the first preferred embodiment and the conventional pixel circuit of FIG. 1 under three different conditions.

Assuming that the logic high level of the voltage from the voltage source (PVDD) is 9V, the logic low level of the voltage from the voltage source (PVDD) is −18V, the logic high level of the scan signal (SCAN) is 9V, the logic low level of the scan signal (SCAN) is −6V, the reference voltage ($V_{REF}$) is −6V, the data signal ($V_{DATA}$) has a voltage range of between −6.25V and −8.75V, the width-to-length ratio ($W_{313}/L_{313}$) of the first transistor 313 is 4 μm/25 μm, the width-to-length ratio ($W_{314}/L_{314}$) of the second transistor 314 is 4 μm/60 μm, the width-to-length ratio ($W_{315}/L_{315}$) of the third transistor 315 is 4 μm/4 μm, and the capacitance of the capacitor 312 is 0.5 pF, FIG. 9 shows simulation results for the driving currents ($I_{DRIVE}$) for the first preferred embodiment under three different conditions, i.e., when the threshold voltage drifts for the first, second and third transistors 313, 314, 315 are all 0V, when the threshold voltage drifts for the first, second and third transistors 313, 314, 315 are all −0.3V, and when the threshold voltage drifts for the first, second and third transistors 313, 314, 315 are all +0.3V. As can be seen from FIG. 11, the driving currents ($I_{DRIVE}$) for the different conditions, which are the differences that would exist among different pixel circuits according to this invention, are substantially identical, whereas the driving currents ($I_{DRIVE}$) under the same conditions for the conventional pixel circuits of FIG. 1 are different.

Figure 10:
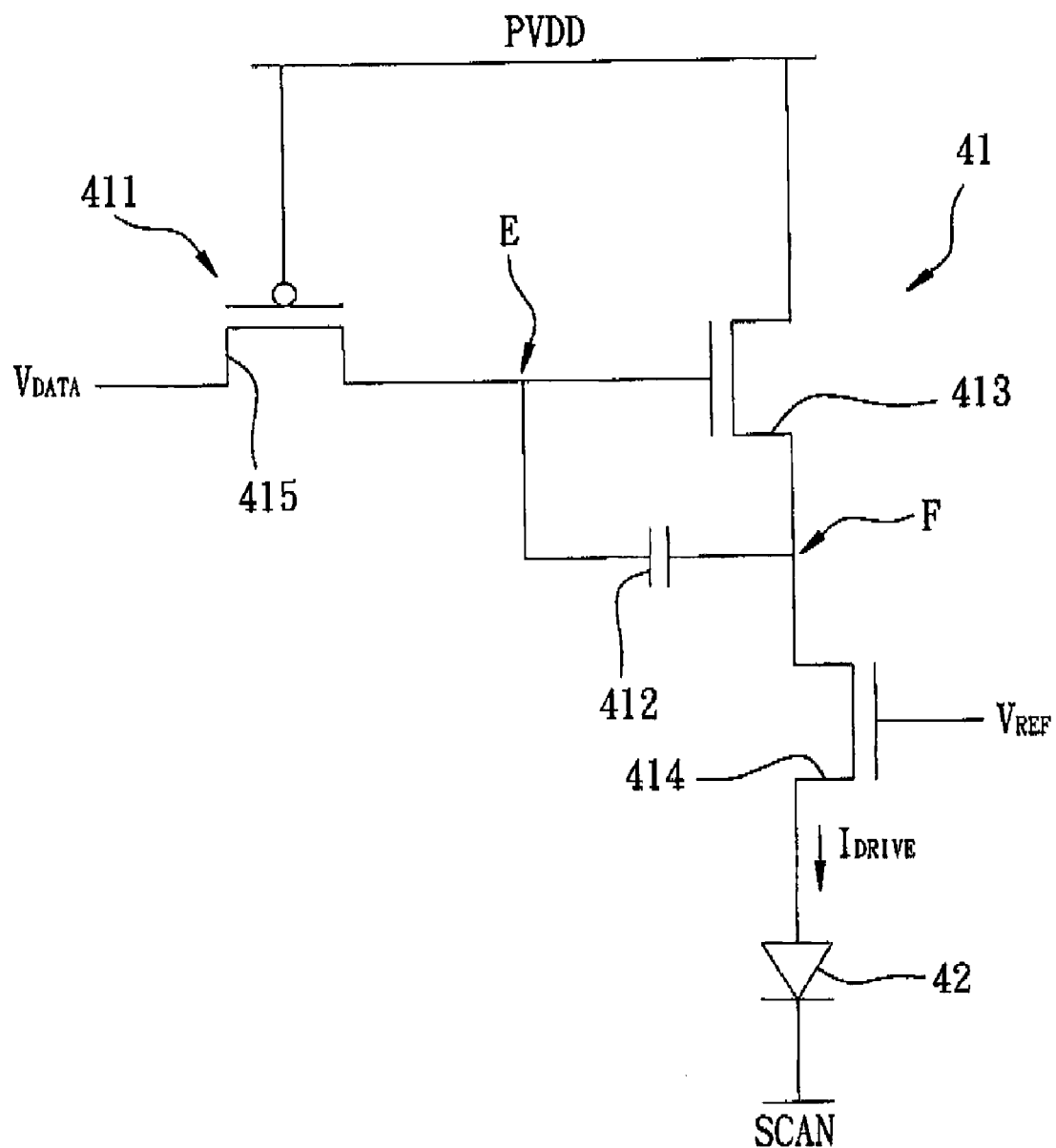
FIG. 10 is an electrical circuit diagram of the second preferred embodiment of a pixel circuit according to the present invention.

With reference to FIG. 10, the second preferred embodiment of a pixel circuit according to the present invention includes a light emitting diode 42 and a driving circuit 41. The light emitting diode 42 has an anode that receives a driving current ($I_{DRIVE}$), and a cathode that is adapted for receiving a scan signal (SCAN). In this embodiment, the light emitting diode 42 is an organic light emitting diode (OLED). The driving circuit 41 includes a switch unit 411, a capacitor 412, a first transistor 413, and a second transistor 414.

The switch unit 411 is adapted for coupling to a voltage source (PVDD), is operable in one of an on state and an off state according to a voltage signal from the voltage source (PVDD), and is adapted for permitting transfer of a data signal ($V_{DATA}$) when operating in the on state.

The capacitor 412 has a first end that is coupled electrically to the switch unit 411, and a second end.

The first transistor 413 has a first terminal that is adapted for coupling to the voltage source (PVDD), a second terminal that is coupled electrically to the second end of the capacitor 412, and a control terminal that is coupled electrically to the first end of the capacitor 412.

The second transistor 414 has a first terminal that is coupled electrically to the second end of the capacitor 412, a second terminal that is coupled electrically to the anode of the light emitting diode 42, and a control terminal that is adapted for receiving a reference voltage ($V_{REF}$).

In this embodiment, the switch unit 411 includes a third transistor 415 having a first terminal that is adapted for receiving the data signal ($V_{DATA}$), a second terminal that is coupled electrically to the control terminal of the first transistor 413, and a control terminal that is adapted for coupling to the voltage source (PVDD). Each of the first and second transistors 413, 414 is one of an N-type thin film transistor (TFT) and an N-type metal oxide semiconductor (MOS), and the third transistor 415 is one of a P-type thin film transistor (TFT) and a P-type metal oxide semiconductor (MOS). In this embodiment, each of the first and second transistors 413, 414 is an N-type TFT, and the third transistor 415 is a P-type TFT.

In the following description, the second terminal of the third transistor 415, the control terminal of the first transistor 413, and the first end of the capacitor 412 are hereinafter collectively referred to as node (E). The second terminal of the first transistor 413, the second end of the capacitor 412, and the first terminal of the second transistor 414 are hereinafter collectively referred to as node (F).

Figure 11:
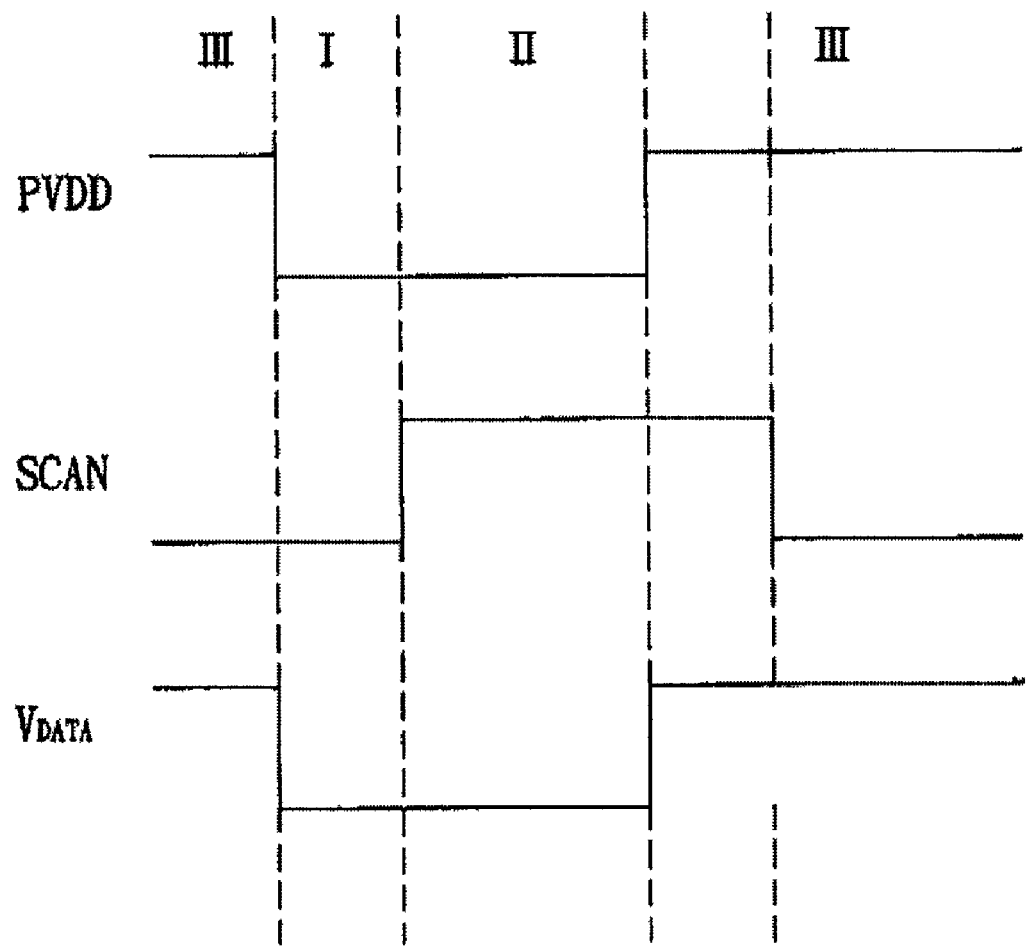
FIG. 11 illustrates timing sequences of PVDD, SCAN and $V_{DATA}$ signals for the second preferred embodiment.

Shown in FIG. 11 are timing sequences of the voltage signal from the voltage source (PVDD), the scan signal (SCAN), and the data signal ($V_{DATA}$) for the driving circuit 41. The second transistor 414 and the switch unit 411 are not simultaneously turned off. The first transistor 413 generates the driving current ($I_{DRIVE}$) to be received by the light emitting diode 42 when the switch unit 411 operates in the off state and when the scan signal (SCAN) is at a logic low level. Operation of the second preferred embodiment can be divided into three phases, and is described in detail hereinbelow with reference to FIG. 11.

I. Preparation Phase

When the voltage signal from the voltage source (PVDD) is at a logic low level, and the scan signal (SCAN) is at a logic low level, the third transistor 415 is turned on (i.e., the switch unit 411 operates in the on state), and the second transistor 414 is turned on. At this time, the data signal ($V_{DATA}$) is transmitted to the node (E), and the voltage at the node (F) is equal to the logic low level of the scan signal (SCAN) plus a voltage across the light emitting diode 42. The light emitting diode 42 is forward biased, and the first transistor 413 does not generate the driving current ($I_{DRIVE}$).

II. Data Inputting Phase

When the voltage signal from the voltage source (PVDD) is at a logic low level, and the scan signal (SCAN) is at a logic high level, the third transistor 415 is turned on (i.e., the switch unit 411 operates in the on state), and the second transistor 414 is turned off. At this time, and the voltage at the node (F) is pulled up from the logic low level of the scan signal (SCAN) plus the voltage across the light emitting diode 42 to the reference voltage ($V_{REF}$) minus a threshold voltage for the second transistor 414. The light emitting diode 42 is reverse biased, and the first transistor 413 does not generate the driving current ($I_{DRIVE}$).

III. Light Emitting Phase

When the voltage signal from the voltage source (PVDD) is at the logic high level, and the scan signal (SCAN) is at the logic low level, the third transistor 415 is turned off (i.e., the switch unit 411 operates in the off state), and the second transistor 414 is turned on. At this time, the light emitting diode 42 is forward biased, and the first transistor 413 generates the driving current ($I_{DRIVE}$) with reference to the voltage across the capacitor 412 according to the following formula:

$$I_{DRIVE} = \frac{1}{2}\mu_n C_{ox} \frac{W_{413}}{L_{413}} (V_{C,412} - V_{TH,413})^2$$
$$= \frac{1}{2}\mu_n C_{ox} \frac{W_{413}}{L_{413}} (V_{DATA} - V_{REF} + V_{TH,414} - V_{TH,413})^2$$

where ($W_{413}$) and ($L_{413}$) are respectively width and length of the first transistor 413, ($V_{C,412}$) is the voltage across the capacitor 412, ($V_{TH,413}$) is the threshold voltage for the first transistor 413, and ($V_{TH,414}$) is the threshold voltage for the second transistor 414. Since the first and second transistors 413, 414 are very close to each other in location, the threshold voltages thereof can be assumed to be identical. Therefore, the formula can be simplified and rewritten as follows.

$$I_{DRIVE} = \frac{1}{2}\mu_n C_{ox} \frac{W_{413}}{L_{413}} (V_{DATA} - V_{REF})^2$$

Since the effect on the driving current ($I_{DRIVE}$) due to the threshold voltage of the first transistor 413 for each of the pixel circuits is canceled out by that due to the threshold voltage of the second transistor 414, the driving circuits 31 of different pixel circuits of the present invention can generate substantially identical driving currents ($I_{DRIVE}$) when the data signals ($V_{DATA}$) supplied thereto are the same, thereby resulting in substantially identical luminance intensity of light emitted by the light emitting diodes 42. In addition, since the driving currents ($I_{DRIVE}$) are unaffected by the voltage across the light emitting diode 42, the driving currents ($I_{DRIVE}$) will not diminish as the light emitting diode 42 deteriorates with time.

Figure 5:
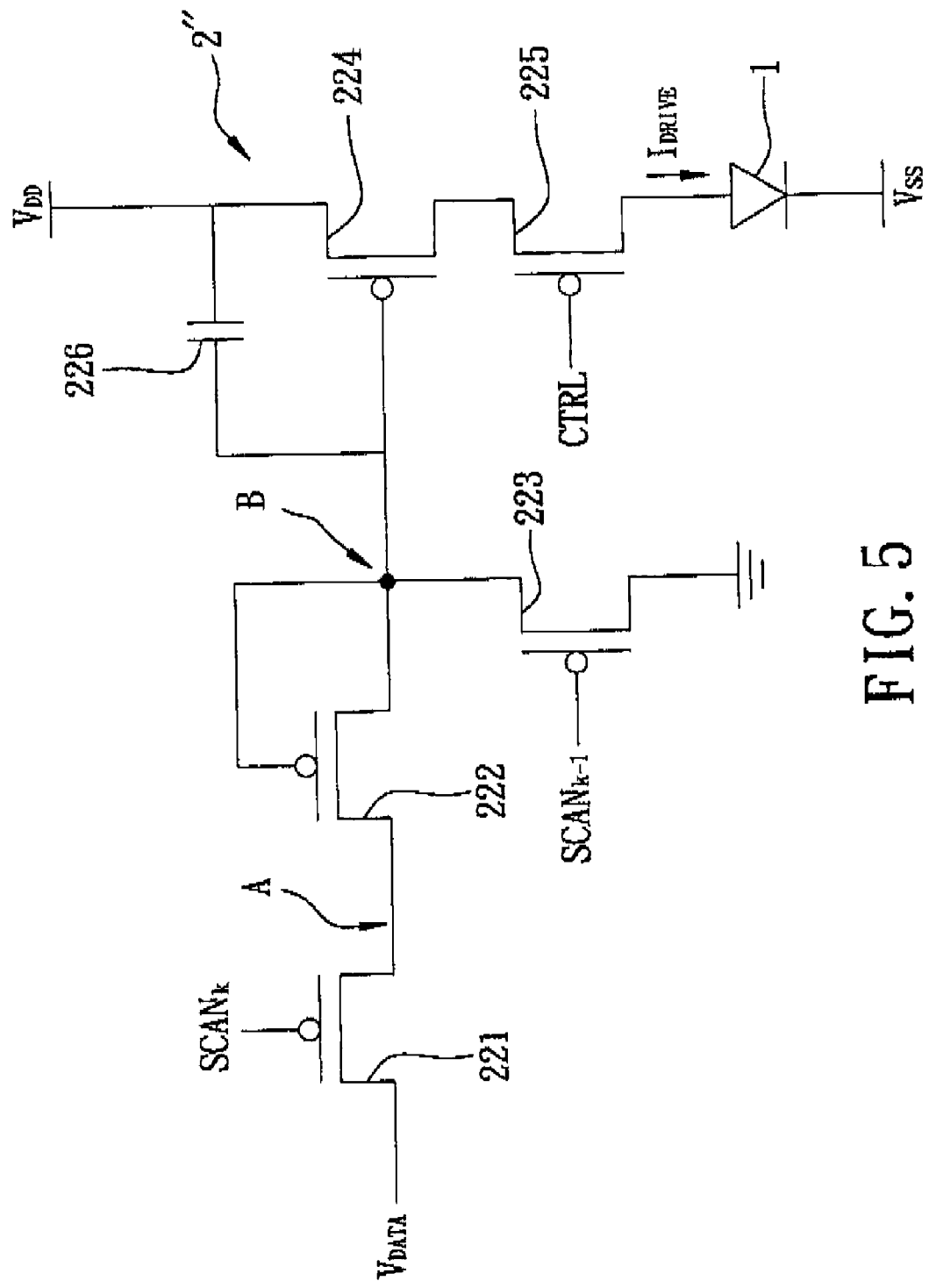
FIG. 5 is an electrical circuit diagram of a pixel circuit incorporating a third conventional driving circuit.
Figure 6:
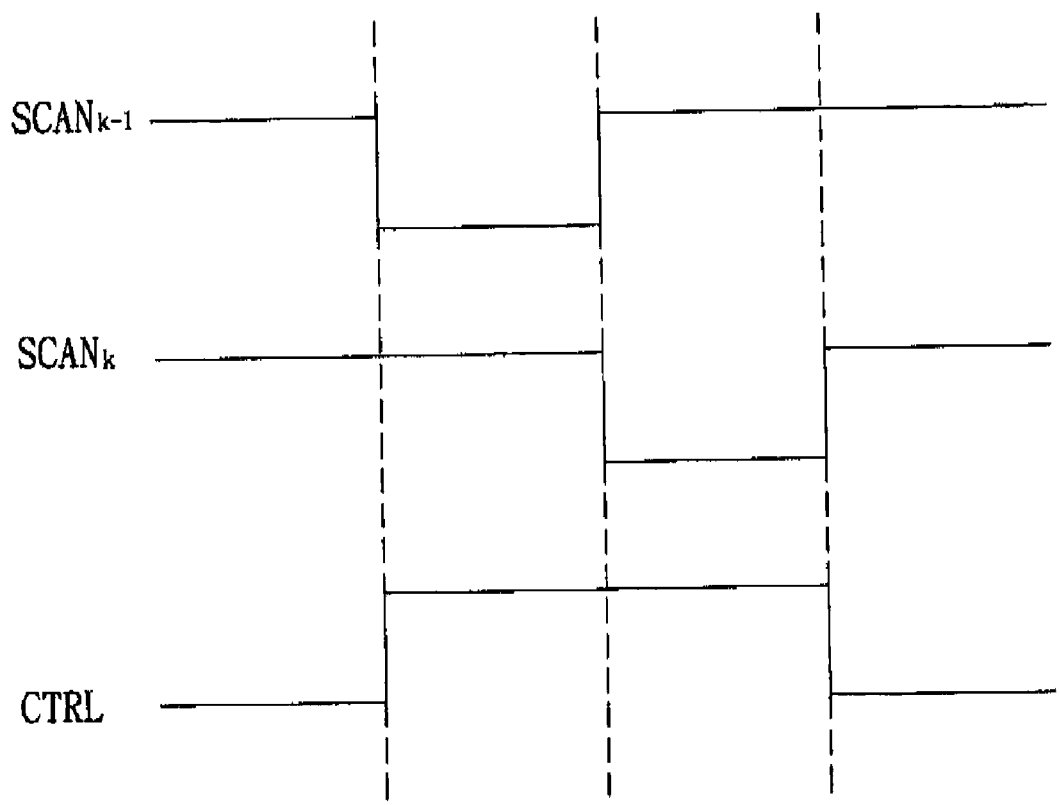
FIG. 6 illustrates timing sequences of $SCAN_k$, $SCAN_{k-1}$ and $V_{DATA}$ signals for the third conventional driving circuit of FIG. 5.

In summary, the present invention utilizes the second transistor 314, 414 to compensate for the effect of threshold voltage variation of the first transistor 313, 413 on the driving current ($I_{DRIVE}$), such that the driving currents ($I_{DRIVE}$) generated by different driving circuits 31, 41 for driving different light emitting diodes 32, 42 are substantially identical when the same data signals ($V_{DATA}$) are supplied, thereby resulting in substantially identical luminance among the light emitting diodes 32, 42. In addition, effects of the voltage drop across the signal line transferring the reference voltage ($V_{REF}$) and the deterioration of the light emitting diode 32, 42 are also eliminated in the present invention. Furthermore, the total number of transistors used in the pixel circuit of the present invention that incorporates the driving circuit 31, 41 is fewer than that of the third conventional driving circuit 2" (as shown in FIG. 5) by two, thereby increasing the aperture ratio (i.e., the ratio of coverage area of effective illuminating display region) of the OLED display utilizing the present invention. Moreover, the light emitting diode 32, 42 is reverse biased for a period of time during operation of the pixel circuits of the present invention for enabling the light emitting diode 32, 42 to release electrical charges accumulated thereby, thereby prolonging the service life of the light emitting diode 32, 42.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A pixel circuit comprising:
a light emitting diode having an anode that receives a driving current, and a cathode that is adapted for receiving a scan signal; and
a driving circuit including:
a switch unit that is adapted for directly coupling to a voltage source, that is operable in one of an on state and an off state according to a voltage signal from the voltage source, and that is adapted for permitting transfer of a data signal when operating in the on state;
a capacitor having a first end that is coupled directly and electrically to said switch unit, and a second end;
a first transistor having a first terminal that is coupled directly and electrically to said second end of said capacitor, a second terminal that is coupled electrically to said anode of said light emitting diode, and a control terminal that is coupled directly nod electrically to said first end of said capacitor so as to receive the data signal when said switch unit operates in the on state; and a second transistor having a first terminal that is adapted for coupling to the voltage source, a second terminal that is coupled electrically to said first terminal of said first transistor, and a control terminal that is adapted for receiving a reference voltage.

2. The pixel circuit as claimed in claim 1, wherein each of said first and second transistors is one of a P-type thin film transistor and a P-type metal oxide semiconductor.

3. The pixel circuit as claimed in claim 1, wherein said switch unit includes a third transistor having a first terminal that is adapted for receiving the data signal, a second terminal that is coupled electrically to said control terminal of said first transistor, and a control terminal that is adapted for coupling to the voltage source.

4. The pixel circuit as claimed in claim 3, wherein each of said first, second and third transistors is one of a P-type thin film transistor and a P-type metal oxide semiconductor.

5. The pixel circuit as claimed in claim 1, wherein said second transistor is turned on when said switch unit operates in the off state, and is turned off when said switch unit operates in the on state, said first transistor generating the driving current to be received by said light emitting diode when said switch unit operates in the off state and when said scan signal is at a logic low level.

6. The pixel circuit as claimed in claim 1, wherein said light emitting diode is an organic light emitting diode (OLED).

7. A pixel circuit comprising:
a light emitting diode having an anode that receives a driving current, and a cathode that is adapted for receiving a scan signal; and
a driving circuit including:
a switch unit that is adapted for directly coupling to a voltage source, that is operable in one of an on state and an off state according to a voltage signal from the voltage source, and that is adapted for permitting transfer of a data signal when operating in the on state;
a capacitor having a first end that is coupled directly and electrically to said switch unit, and a second end;
a first transistor having a first terminal that is adapted for coupling to the voltage source, a second terminal that is coupled directly and electrically to said second end of said capacitor so as to receive the data signal when said switch unit operates in the on state, and a control terminal that is coupled electrically to said first end of said capacitor; and
a second transistor having a first terminal that is coupled directly and electrically to said second end of said capacitor, a second terminal that is coupled electrically to said anode of said light emitting diode, and a control terminal that is adapted for receiving a reference voltage.

8. The pixel circuit as claimed in claim 7, wherein each of said first and second transistors is one of an N-type thin film transistor and an N-type metal oxide semiconductor.

9. The pixel circuit as claimed in claim 7, wherein said switch unit includes a third transistor having a first terminal that is adapted for receiving the data signal, a second terminal that is coupled electrically to said control terminal of said first transistor, and a control terminal that is adapted for coupling to the voltage source.

10. The pixel circuit as claimed in claim 9, wherein each of said first and second transistors is one of an N-type thin film transistor and an N-type metal oxide semiconductor, said third transistor being one of a P-type thin film transistor and a P-type metal oxide semiconductor.

11. The pixel circuit as claimed in claim 7, wherein said second transistor and said switch unit are not simultaneously turned off, said first transistor generating the driving current to be received by said light emitting diode when said switch unit operates in the off state and when said scan signal is at a logic low level.

12. The pixel circuit as claimed in claim 7, wherein said light emitting diode is an organic light emitting diode (OLED).

* * * * *